(12) United States Patent
Horiuchi et al.

(10) Patent No.: US 8,362,369 B2
(45) Date of Patent: Jan. 29, 2013

(54) WIRING BOARD

(75) Inventors: Michio Horiuchi, Nagano (JP); Yasue Tokutake, Nagano (JP); Yuichi Matsuda, Nagano (JP); Masao Nakazawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 281 days.

(21) Appl. No.: 12/792,334

(22) Filed: Jun. 2, 2010

(65) Prior Publication Data

US 2010/0307808 A1   Dec. 9, 2010

(30) Foreign Application Priority Data

Jun. 3, 2009  (JP) ................................. 2009-134005

(51) Int. Cl.
*H05K 1/11* (2006.01)

(52) U.S. Cl. ........................................ 174/264; 174/262

(58) Field of Classification Search .................. 174/262, 174/264, 255, 258; 257/784, E23.01
See application file for complete search history.

(56) References Cited

U.S. PATENT DOCUMENTS

| 4,463,084 A | 7/1984 | Mitsumori |
| 6,093,476 A | 7/2000 | Horiuchi |
| 6,620,650 B2 * | 9/2003 | Nakata et al. ................ 438/107 |
| 8,008,583 B2 * | 8/2011 | Kariya et al. ................. 174/260 |
| 2006/0243972 A1 * | 11/2006 | Uang et al. ..................... 257/40 |

FOREIGN PATENT DOCUMENTS

| JP | 58-137915 | | 8/1983 |
| JP | 58-141595 | | 8/1983 |
| JP | 10-308565 | | 11/1998 |
| JP | 2004-273480 A1 | | 9/2004 |
| JP | 2004273480 | * | 9/2004 |
| JP | 2009-147241 A1 | | 7/2009 |

* cited by examiner

*Primary Examiner* — Yuriy Semenenko
(74) *Attorney, Agent, or Firm* — Kratz, Quintos & Hanson, LLP

(57) ABSTRACT

A wiring board includes a core substrate having a structure including an insulating base material and a large number of filamentous conductors densely provided in the insulating base material and piercing the insulating base material in a thickness direction thereof. Pads made of portions of wiring layers are oppositely disposed on both surfaces of the core substrate and electrically connected to opposite ends of a plurality of filamentous conductors in such a manner that the pads share the filamentous conductors. A wiring connection between one surface side and the other surface side of the core substrate is made through the pads. The insulating base material is made of an inorganic dielectric. Pads made of portions of the wiring layers are disposed on both surfaces of the core substrate and electrically connected only to corresponding one end sides of different groups each formed of a plurality of filamentous conductors.

6 Claims, 6 Drawing Sheets

WIRING BOARD

CROSS-REFERENCE TO RELATED APPLICATIONS

This application is based on and claims priority of Japanese Patent Application No. 2009-134005 filed on Jun. 3, 2009, the entire contents of which are incorporated herein by reference.

BACKGROUND OF THE INVENTION (a) Field of the Invention

The present invention relates to a wiring board used for mounting an electronic component such as a semiconductor element. Particularly, it relates to a wiring board having a structure including a core substrate used as a base material and wiring layers laminated on the respective surfaces of the core substrate.

Since such a wiring board plays a role in mounting a semiconductor element (chip) or the like, it is also referred to as a "semiconductor package" or simply a "package" for convenience in the description below.

(b) Description of the Related Art

A semiconductor package of a ball grid array (BGA), land grid array (LGA), pin grid array (PGA) or other types is manufactured generally as follows. First, a core layer (core substrate) is prepared as a base material of the package. A multilayer wiring structure is formed on at least one surface of the core layer, for example, by a build-up process. The build-up process involves sequentially repeating formation of an insulating layer, formation of via holes in the insulating layer, and formation of a conductor pattern (wiring layer) inclusive of the insides of the via holes. Eventually, the outermost surface is covered with a protection film. The protection film is opened at a desired position to expose a portion (pad) of the conductor pattern. Furthermore, in the case of the BGA or PGA, a ball or a pin is bonded to the exposed pad as an external connection terminal.

A chip component such as a semiconductor element is mounted on one surface of such a semiconductor package. The semiconductor package is mounted on a mounting board such as a motherboard via the external connection terminals provided on the other surface of the semiconductor package. Namely, the chip component is electrically connected to the mounting board through the semiconductor package. For this reason, as means for electrically conducting between the two surfaces of the core substrate, through-holes are formed in the core substrate serving as the base material of the package. Each of the through-holes is filled with a conductive material. Connecting pads are provided on both ends of the conductor filled in each of the through-holes (i.e., on the surface of the core substrate). The connecting pad facilitates the interlayer connection between the wiring layers on the respective surfaces of the core substrate.

In the conventional method, a base material (for example, a plate having copper-clad laminates on both surfaces in the case of a plastic package; a green sheet obtained by binding a powder of alumina, aluminum nitride, or the like with an organic resin in the case of a ceramic package) having predetermined size and thickness is prepared in accordance with the type of the package, the function of the chip component to be mounted, and so forth. Through-holes (each having a diameter of approximately 300 μm in the state of the art) are formed at desired positions of the base material by a perforating process such as mechanical drilling. The resultant surface of the base material in the case of the ceramic package is further subjected to a metallizing process. Then, the resultant surface is subjected to, for example, electroplating in the case of the plastic package, or subjected to, for example, a screen printing method using a conductive paste in the case of the ceramic package. Thus, a conductor pattern (including the connecting pads) is formed in such a manner that the through-holes are filled with the conductive material.

Namely, for each desired package, a specific core substrate has to be prepared, which is then is subjected to a perforating process (formation of through-holes), metallizing process (formation of a metal layer), filling process (filling the through-holes with a conductor), and so forth.

An example of a technique related to the above-mentioned prior art is described in Japanese unexamined Patent Publication (JPP) (Kokai) 10-308565. A wiring board disclosed in this document has a structure including a core substrate in which filled-vias each having a uniform diameter of 300 μm or less are formed in a matrix pattern at equal pitches of 2 mm or less. A planar wiring pattern is formed on a surface of the core substrate with an insulating layer interposed therebetween. Each pad portion of the wiring pattern is electrically connected to the corresponding filled-via on a one-to-one basis through a communication-via which pierces the insulating layer.

As another related technique, JPP 2004-273480 describes a wiring board using, as a base material, a substrate made of a porous metal oxide film having multiple through-holes formed therein. Among the through-holes formed in the board, through-holes formed at positions where an electrode is disposed on the board are filled with a conductive material, while the other through-holes are filled with an insulating material.

To manufacture the conventional wiring board (package) as mentioned above, the following processes have to be performed. Specifically, through-holes are formed in a core substrate as means for electrically connecting between wiring layers on both sides of the core substrate. Further, connecting pads are formed on both surfaces of each through-hole (filled with a conductor). In forming the through-holes (including the connecting pads), a specific core substrate is prepared in accordance with the type of the package, the function of the chip component to be mounted, and so forth. The core substrate is subjected to, for example, perforating, metallizing, filling, and other processes.

Such a manufacturing procedure has the following problems. Specifically, it takes a long time to manufacture a core substrate suitable for the package, and an intended core substrate cannot be efficiently manufactured. Moreover, since the time to manufacture the core substrate is long, the overall manufacturing cost is increased.

Meanwhile, the diameter of each of the connecting pads has to be increased in accordance with the processing accuracy and alignment accuracy of the through-holes in the core substrate, the lamination accuracy of the wiring layers, and so forth. This leads to other problems of impaired freedom in wiring design and restriction in wiring density. Particularly, as smaller electronic devices or devices with other features are demanded, the diameter and arrangement pitch of the through-holes approach the achievable limits in the state of the art. Accordingly, the wiring density of the entire wiring board is further restricted.

SUMMARY OF THE INVENTION

An object of the present invention is to provide a wiring board capable of sharing a core substrate, reducing cost, improving the wiring density, and enhancing the freedom in wiring design.

According to the invention, there is provided a wiring board including: a core substrate having a structure including an insulating base material made of an inorganic dielectric and a large number of filamentous conductors densely provided in the insulating base material and piercing the insulating base material in a thickness direction thereof; a pair of pads made of portions of wiring layers, respectively, and oppositely disposed on both surfaces of the core substrate and electrically connected to opposite ends of a plurality of filamentous conductors in such a manner that the pads share the filamentous conductors; and pads made of portions of the wiring layers, respectively, and disposed on both surfaces of the core substrate, the pads being electrically connected only to corresponding one end sides of different groups each formed of a plurality of filamentous conductors, in which a wiring connection between one surface side and the other surface side of the core substrate is made through the pair of pads.

In the configuration of the wiring board according to the present invention, the pair of pads (portions of the wiring layer) are oppositely disposed on both surfaces of the core substrate in such a manner that the pads share the plurality of filamentous conductors formed to pierce the insulating base material in the thickness direction thereof. Accordingly, a wiring on one surface side of the core substrate is electrically connected to a wiring on the other surface side via the pads disposed oppositely to each other.

Namely, by properly altering the sizes and positions of the pads disposed on both surfaces of the core substrate, the connection between the respective surfaces of the core substrate can be easily made through the pads and the plurality of filamentous conductors connected therewith. Thus, it is no longer necessary to prepare a specific core substrate in accordance with the type of a wiring board, the function of a chip component to be mounted, and so forth, as in the conventional technique.

In this manner, according to the present invention, the core substrate is shared and thus the reduction in cost can be achieved. Moreover, the diameter of a connecting pad does not need to be increased in accordance with the alignment accuracy of through-holes in the core substrate, and so forth, as carried out in the prior art. As a result, the freedom in wiring design can be enhanced and thus the wiring density can be improved.

DESCRIPTION OF THE PREFERRED EMBODIMENTS

Description is given below with regard to preferred embodiments of the present invention with reference to the accompanying drawings.

Figure 1:
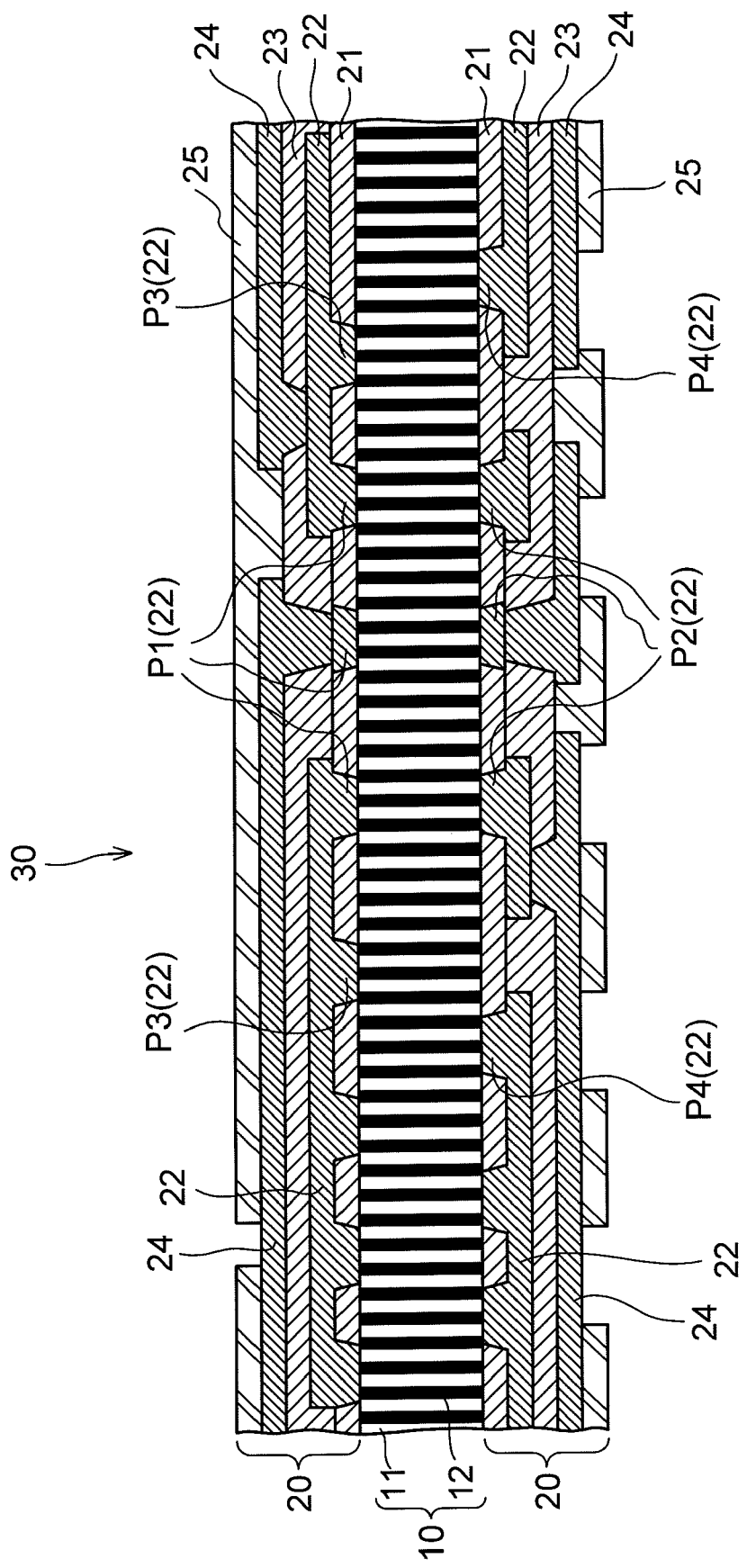
FIG. 1 is a sectional view showing the configuration of a wiring board (semiconductor package) according to an embodiment of the present invention.

FIG. 1 shows in a sectional view the configuration of a wiring board (semiconductor package) according to an embodiment of the present invention. A wiring board (package) 30 of this embodiment is intended as described later for use while being mounted on a mounting board such as a motherboard via external connection terminals provided on one surface of the wiring board 30 with a semiconductor element (silicon chip) mounted on the other surface of the wiring board 30.

The wiring board 30 according to this embodiment, as illustrated, includes a core substrate 10 used as a base material thereof, and build-up layers 20 each having a desired number of laminated layers on the corresponding surface of the core substrate 10. Each of the build-up layers 20 includes: an insulating layer 21; a conductor layer (first wiring layer) 22; an insulating layer 23; a conductor layer (second wiring layer) 24; and further an insulating layer (solder resist layer) 25. The insulating layer 21 is formed on the core substrate 10. The wiring layer 22 is patterned into a desired shape on the insulating layer 21 while filling via holes formed at desired positions of the insulating layer 21. The insulating layer 23 is formed on the wiring layer 22. The wiring layer 24 is patterned into a desired shape on the insulating layer 23 while filling via holes formed at desired positions of the insulating layer 23. The insulating layer 25 is formed as a protection film to cover the surface of the wiring layer 24 but to expose pad portions defined at desired positions of the wiring layer 24. Copper (Cu) is typically used as the material of the wiring layers 22 and 24. A resin represented by an epoxy resin or the like is used as the material of the insulating layers 21, 23, and 25.

The core substrate 10 used as the base material is a member characterizing the present invention, and has a structure including an insulating base material 11 having a desired thickness and filamentous conductors 12 each having a small diameter. The filamentous conductors 12 are densely provided in the insulating base material 11 at predetermined intervals, piercing the insulating base material 11 in a thickness direction thereof. Each of the filamentous conductors 12 is specifically formed in such a manner that both ends of the filamentous conductor 12 are exposed from the respective surfaces of the insulating base material 11.

A material having a highest possible permittivity is desirably used as the insulating base material 11 because, as described later, portions of the core substrate 10 are used as capacitors. For example, an inorganic dielectric such as alumina (aluminum oxide) can be preferably used. Moreover, by using an inorganic material such as alumina, the coefficient of thermal expansion (CTE) of the core substrate 10 as a whole, and therefore the CTE of the package 30 as a whole, can be made closer to the CTE of a semiconductor (silicon) chip mounted on this package 30. Incidentally, the CTE of silicon constituting a chip is approximately 3 ppm/° C., while the CTE of alumina constituting the insulating base material 11 is approximately 6 to 7 ppm/° C.

Figure 2A:
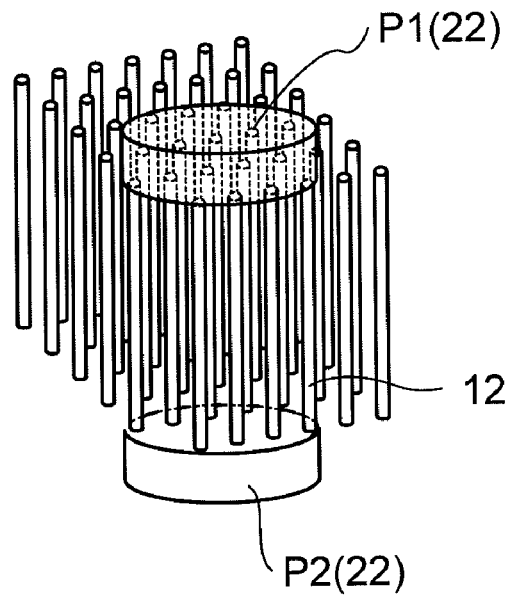
FIGS. 2A and 2B are enlarged perspective views schematically showing the configuration of a principal part of the wiring board in FIG. 1 (showing the relationship between filamentous conductors in a core substrate and pads connected to the filamentous conductors)
Figure 2B:
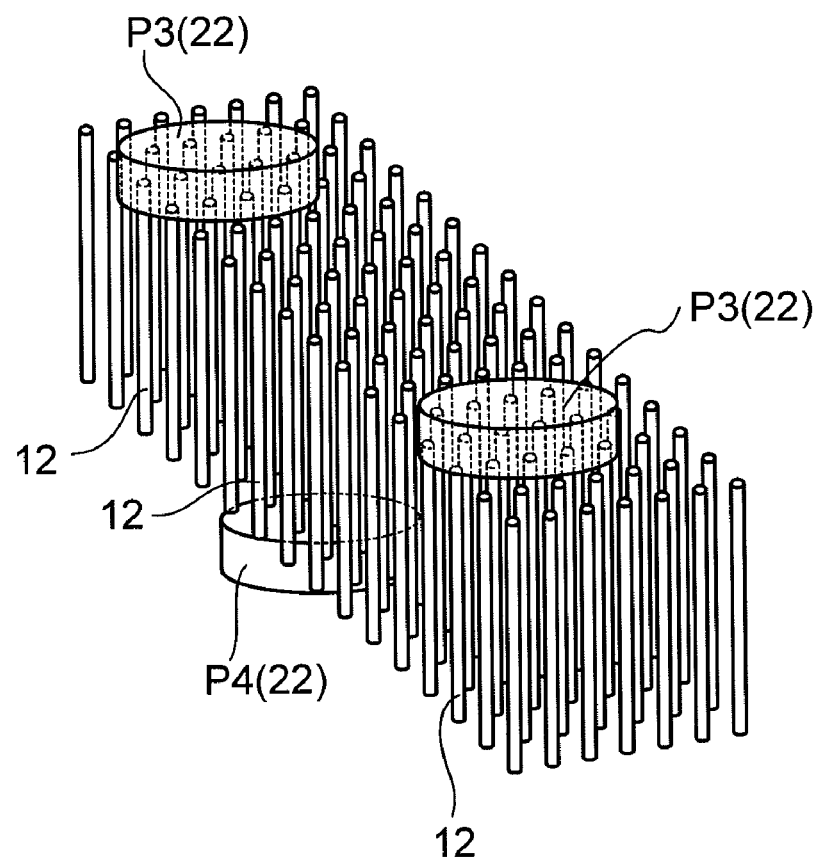

Furthermore, pads are disposed at desired positions of the both surfaces of the core substrate 10, and each pad is formed from a portion of the wiring layer 22 (i.e., the pad is formed simultaneously when the wiring layer 22 is formed). FIGS. 2A and 2B schematically show the arrangement of the pads (the relative relationships between the filamentous conductor 12 in the core substrate 10 and the pads connected to the filamentous conductor 12).

Specifically, the pads formed on the surfaces of the core substrate 10 include: a pair of pads P1 and P2 oppositely disposed on (connected to) the opposite ends of groups each formed of a plurality of filamentous conductors 12 in such a manner that the pair of pads P1 and P2 share the filamentous conductors 12 as shown in FIG. 2A; and pads P3 and P4 respectively connected only to corresponding one end sides of different groups each formed of a plurality of filamentous conductors 12 as shown in FIG. 2B. In the arrangement shown in FIG. 2A, the pads P1 and P2 disposed opposite to each other are electrically connected through the plurality of filamentous conductors 12. Meanwhile, in the arrangement shown in FIG. 2B, the pads P3 formed on one surface of the core substrate 10 and the plurality of filamentous conductors 12 connected to the pads P3 are not electrically connected, but are capacitively coupled only through the dielectric (insulating base material 11), to the pads P4 formed on the other surface of the core substrate 10 and the plurality of filamentous conductors 12 connected to the pads P4.

In this manner, a large number of the filamentous conductors 12 provided in the core substrate 10 are electrically connected as the groups to any of the pads P1, P2, P3 and P4 as exemplified in FIGS. 2A and 2B. Meanwhile, as illustrated, there are also some filamentous conductors 12 which are not connected to and thus isolated from any of the pads P1 to P4.

The filamentous conductor 12 is formed by filling a metal material in through-holes formed in the insulating base material 11 as described later. The filamentous conductor 12 has roughly two roles in this embodiment. One is, as exemplified in FIG. 2A, to surely receive a signal at one end of the filamentous conductor 12 (or any one of the pads P1 and P2 disposed opposite to each other) and transmit the signal to the other end (or the other pad on the opposite side). Namely, the filamentous conductor plays a role in electrically connecting the wiring layers 22 and 24 on the one surface of the core substrate 10 to the wiring layers 22 and 24 on the other surface thereof through the core substrate 10. This role is equivalent to the role of a conventional through-hole (and a conductor filled therein) provided in a core substrate.

The other role is to prevent disadvantageous signal coupling (noise) between one circuit and another caused otherwise through the power supply line. Specifically, the pads P3 and P4 as exemplified in FIG. 2B are not directly connected to each other as the pads in FIG. 2A. One of the pads P3 and P4 is connected to the power supply line, and the other is connected to the ground line. This can make the filamentous conductor function as a capacitor between the two to prevent signal coupling (noise). Additionally, such a capacitive component has a role in supplying an instaneous current.

The filamentous conductors 12 provided in the core substrate 10 need to play important roles as described above. For this reason, it is desirable that, when a certain region on the insulating base material 11 is selected as a connection portion for the signal at the time of designing, any region thus selected includes a large number of the filamentous conductors 12 on average. Thus, the metal material needs to be densely filled in the insulating base material 11 (hereinafter, a measure of how densely the metal is filled is referred to as metal filling density). The metal filling density needs to be highest possible. Hence, the filamentous conductors 12 each having a small diameter are densely arranged as described above.

In this embodiment, the filamentous conductors 12 are provided in the core substrate 10 in such a manner that a distance D between each adjacent two of the filamentous conductors 12 is smaller than a diameter "d" of each of the filamentous conductors (D<d). More preferably, the diameter "d" of the filamentous conductor 12 is selected to be approximately 30 nm to 2 μm. The way to arrange the filamentous conductors 12 is not particularly limited as long as D<d. For example, the filamentous conductors 12 may be arranged in a hexagonal pattern or in a grid pattern. Meanwhile, the pads P1, P2, P3, and P4 formed on both of the surfaces of the core substrate 10 are disposed on the groups of the plurality of filamentous conductors 12 as described above. When the diameter of each pad is selected to be, for example, approximately 90 to 100 μm, several thousands of the filamentous conductors 12 are connected to the pad.

The insulating layers 21 are formed to cover a region between the pads P1 and P3 and a region between the pads P2 and P4 on the respective surfaces of the core substrate 10 thus configured. To be exact, after the insulating layers 21 are formed on the surfaces of the core substrate 10 as described later, the via holes are formed at desired position (where the pads are to be formed) of the insulating layers 21. A conductive material is filled in the via holes to thus form the pads. When the conductive material is filled, the first wiring layers 22 are simultaneously formed. Namely, the pads P1 to P4 are integrally formed with the corresponding wiring layers 22. Subsequently, on each of the wiring layers 22, the insulating layer 23, the second wiring layer 24, and the outermost insulating layer (solder resist layer) 25 are sequentially formed.

A method of manufacturing the wiring board (package) 30 according to this embodiment is described below with reference to FIGS. 3A to 5C which show an example of manufacturing steps thereof.

First, in the first step (see FIG. 3A), an alumina (aluminum oxide) green sheet (having a thickness of approximately 70 to 100 μm and a size of approximately 10×10 mm) is prepared as the insulating base material 11. A large number of through-holes TH are formed in the entire sheet in a thickness direction thereof with a puncher or the like. Specifically, since the filamentous conductors 12 are to be filled in the through-holes TH, the through-holes TH are formed densely so as to satisfy the above-described predetermined relationship: D (the distance between the filamentous conductors 12)<d (the diameter of the filamentous conductor 12).

In this embodiment, the metal filling density in the insulating base material 11 is intended to be highest possible as described above. For this reason, it is desirable to make the diameter "d" of the filamentous conductor 12 smallest possible (preferably, approximately 30 nm to 2 μm). Such a hole (through-hole TH) having a small diameter can be formed by an anodic oxidation method.

For example, an aluminum (Al) substrate having a surface with an insulation coating is prepared. After the surface of the Al substrate is washed, the substrate is immersed into an electrolyte (preferably, an aqueous solution of sulfuric acid). Using the Al substrate as an anode and using a platinum (Pt) electrode disposed on the side opposite to the Al substrate as a cathode, a current is conducted through (a pulse voltage is applied to) the electrolyte. Thereby, a porous metal oxide film (aluminum oxide film having holes each with a small diameter arranged orderly) can be formed on the surface of the Al substrate. Then, a voltage of a reverse potential to that of the anodic oxidation is applied to each of the electrodes (a current is conducted using the Al substrate as the cathode and using the Pt electrode as the anode), Thereby, the porous metal oxide film is separated from the Al substrate. Thus, obtained is the insulating base material (alumina) 11 in which the through-holes TH each having a desired small diameter (approximately 30 nm to 2 μm) are formed densely.

Incidentally, an inorganic material such as titanium oxide, aluminum nitride, mullite, or a glass-ceramic (a composite material of a glass and a ceramic) may be used as the material of the insulating base material 11 instead of alumina (aluminum oxide). Moreover, an inorganic material such as a metal oxide of perovskite structure, for example, barium titanate (BTO), strontium titanate (STO), barium strontium titanate (BST), lead zirconate titanate (PZT), or the like can be used.

In this embodiment, a portion of the core substrate 10 is intended to function as a capacitor. Accordingly, such an inorganic material is preferable as the material of the insulating base material 11 from the viewpoint of having a relatively high permittivity. For example, mullite is advantageously used from the viewpoint of transmitting a signal at a higher speed, although the permittivity thereof is slightly inferior to that of alumina (the permittivity of alumina is approximately 8 to 10, while the permittivity of mullite is 6.5). Mullite is particularly useful when used as a core substrate of a package for mounting a chip component requiring a high-speed switching operation.

In the next step (see FIG. 3B), the filamentous conductors 12 are formed by filling a metal material in the through-holes TH formed in the insulating base material 11. The metal material is filled in the through-holes TH by, for example, a screen printing method, an inkjet method, or the like using a conductive paste such as silver (Ag) and copper (Cu).

Furthermore, both of the surfaces of the resultant insulating base material 11 are polished and planarized as needed by mechanical polishing, chemical mechanical polishing (CMP), or the like. Thus, both ends of each filamentous conductor 12 are exposed from the respective surfaces of the insulating base material 11. Thereby, a structure is formed in which the filamentous conductors 12 each having a small diameter are densely provided in the insulating base material 11 and pierce the insulating base material 11 in the thickness direction as illustrated. Namely, the core substrate 10 is manufactured.

In the next step (see FIG. 3C), insulating layers 21A are formed on the respective surfaces of the core substrate 10. An epoxy resin, a polyimide resin, or the like, which is generally employed in a build-up multilayer wiring plate, is used as the material of the insulating layer 21A. Although any of a thermosetting resin and a photosensitive resin can be used as the resin type, a thermosetting epoxy resin is used in this embodiment. Moreover, the form of the resin is not limited to a liquid resin, and a resin molded into a film can be used. Namely, a thermosetting epoxy resin is coated on the core substrate 10, or a film of a thermosetting epoxy resin is laminated thereon, and thermally cured to form the insulating layer 21A as desired.

In the next step (see FIG. 3D), by a carbon dioxide laser, an excimer laser, or the like, the insulating layers 21A formed on the respective surfaces of the core substrate 10 are opened at desired positions to form via holes VH1 and VH2 which reach the core substrate 10 (formation of the insulating layers 21). The via holes VH1 and VH2 are formed to follow the shapes of the pads P1, P3, P2, and P4 to be formed on the surfaces of the core substrate 10.

In the next step (see FIG. 3E), conductor layers 22A are formed on the insulating layers 21 on the respective surfaces of the core substrate 10 in such a manner that the conductor layers 22A fill the via holes VH1 and VH2 formed in the insulating layers 21. The conductor layers 22A can be formed as follows, for example.

First, seed layers are formed on the respective surfaces of the core substrate 10 (i.e., on the insulating layers 21) by sputtering, electroless plating, or the like. For example, titanium (Ti) conductor layers are formed on the surfaces of the core substrate 10 by sputtering in a thickness of approximately 0.1 μm, and copper (Cu) conductor layers are further formed thereon by sputtering in a thickness of approximately 0.5 μm. Thus, formed are the seed layers each having a two-layer structure (Ti/Cu). The Ti layer, which is the lower layer of each seed layer, is a metal layer for enhancing the adhesion between the upper layer (the Cu layer) and the lower layers (the insulating layer 21 and the insulating base material 11). Instead of Ti, chromium (Cr) may be used. Next, by Cu electroplating using each seed layer as a power supply layer, the conductor (Cu) layer 22A having a desired thickness is formed on the seed layer.

Portions (i.e., conductor portions), filling via holes VH1 and VH2, of the conductor layer 22A thus formed constitute the pads P1, P3, P2, and P4.

In the next step (see FIG. 4A), the first wiring layers 22 of desired shapes are formed by patterning the conductor layers 22A (FIG. 3E) formed on the respective surfaces of the core substrate 10 (i.e., on the insulating layers 21). The first wiring layers 22 can be formed as follows, for example.

First, by using a patterning material, etching resists are formed on the respective surfaces of the core substrate 10 (i.e., on the insulating layers 21), and are opened at desired positions (formation of resist layers including openings). Each of the openings is being patterned to follow the patterning shape of the wiring layer 22 to be formed, so that only the portions corresponding to the patterning shape is left on the surface. As the patterning material, a photosensitive dry film (a film having a structure including a resist material interposed between a polyester cover sheet and a polyethylene separator sheet) or a liquid photoresist (for example, a novolac resin, a liquid resist such as an epoxy resin) can be used.

For example, when a dry film is used, the surface of each of the conductor layers 22A is washed, and then a dry film (from which a separator sheet is separated) is laminated on the washed surface by thermocompression bonding. The dry film is cured by being exposed to ultraviolet (UV) radiation using a mask (unillustrated) which has been patterned into a desired shape. Subsequently, after the cover sheet is separated, the cured portion is etched using a predetermined developer (a developer containing an organic solvent for a negative resist, an alkaline developer for a positive resist). Thus, a desired resist layer (unillustrated) is formed. Similarly, when a liquid photoresist is used, a resist layer (unillustrated) patterned in a desired shape can be formed through the processes of surface washing, resist application on the surface, drying, exposure, and development in this sequence.

Next, using the resist layer as a mask, an exposed portion of the conductor layer (Cu) 22A is removed. Subsequently, an exposed portion of the seed layer (Ti/Cu) after the removal is removed. For example, wet etching is performed using a chemical solution capable of dissolving only Cu, followed by wet etching using a chemical solution capable of dissolving only Ti.

Then, the resist layer used as the etching resist is removed. When the dry film is used as the etching resist, the resist layer can be removed using an alkaline chemical solution such as sodium hydroxide or monoethanolamine. When the liquid resist such as a novolac resin or an epoxy resin is used, the resist layer can be removed using acetone, alcohol, or the like. Thereafter, a predetermined surface washing is performed.

Thus, a structure is formed as illustrated. Specifically, the exposed pads P1 and P2 are oppositely disposed on (connected to) the respective surfaces of the core substrate 10 in such a manner that the pads P1 and P2 share a plurality of filamentous conductors 12; the pads P3 and P4 are respectively connected only to corresponding one end sides of different groups each formed of a plurality of filamentous conductors 12, and are integrally formed with the corresponding wiring layers 22.

Figure 3A:
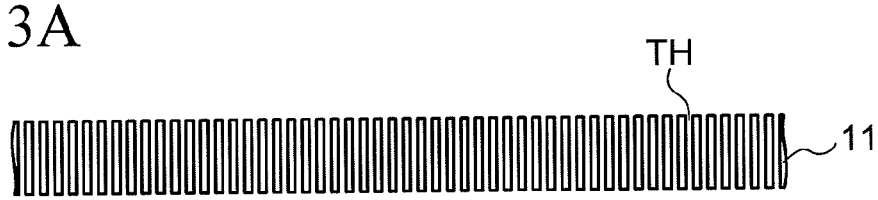
FIGS. 3A to 3E are sectional views showing an example of manufacturing steps for the wiring board in FIG. 1.
Figure 3B:
Figure 3C:
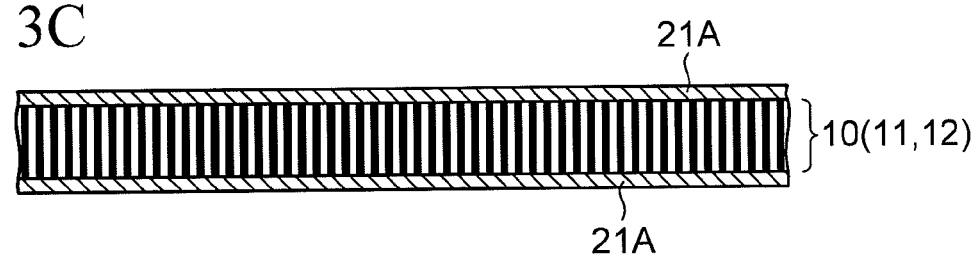

In the next step (see FIG. 4B), in the same manner performed in the step of FIG. 3C, the wiring layer 22 and the exposed insulating layer 21 (including the exposed pad P1 or P2) on each surface side of the core substrate 10 are coated with a thermosetting epoxy resin. Alternatively, a film of a thermosetting epoxy resin is laminated thereon. The resin is thermally cured to form a desired insulating layer 23A.

Figure 3D:
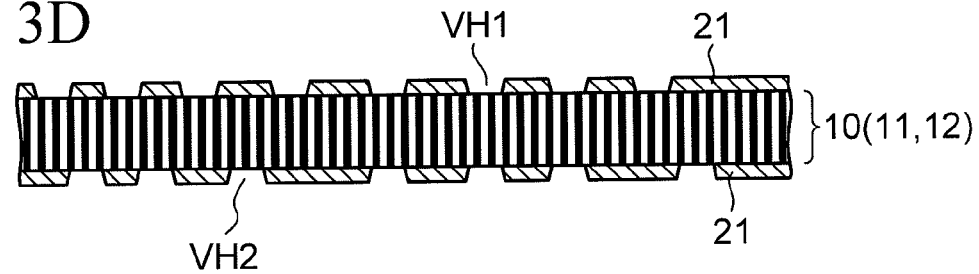

In the next step (see FIG. 4C), in the same manner performed in the step of FIG. 3D, by a carbon dioxide laser, excimer laser, or the like, the insulating layers 23A are opened at desired positions to form via holes VH3 and VH4 (formation of the insulating layers 23). The via holes VH3 and VH4 are formed to follow the shapes of the corresponding pads P1 and P2 oppositely disposed on the respective surfaces of the core substrate 10, and pads (unillustrated) defined in the wiring layers 22.

Figure 3E:
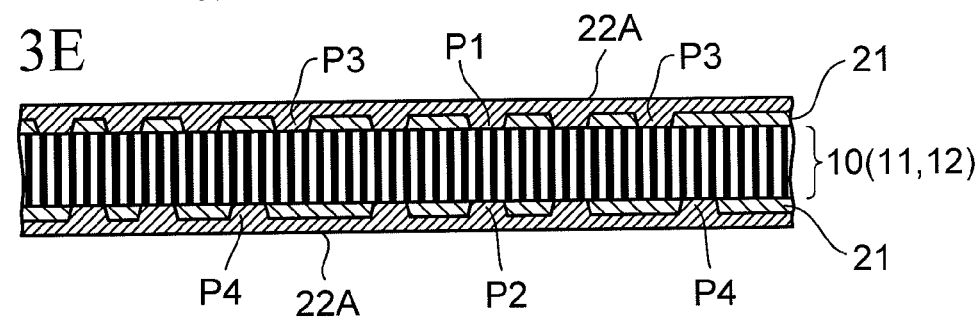

In the next step (see FIG. 5A), in the same manner performed in the step of FIG. 3E, conductor (Cu) layers 24A are formed on the insulating layers 23 on the respective sides of the core substrate 10 in such a manner that the conductor layers 24A fill the via holes VH3 and VH4 (FIG. 4C) formed in the insulating layers 23.

Figure 4A:
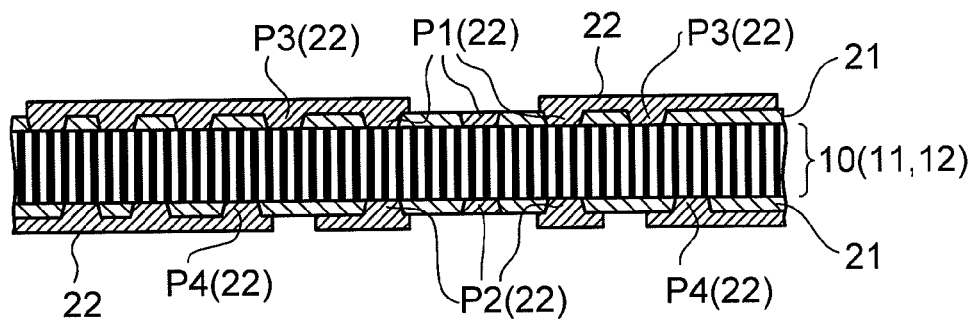
FIGS. 4A to 4C are sectional views showing steps following the manufacturing steps shown in FIGS. 3A to 3E.
Figure 4B:
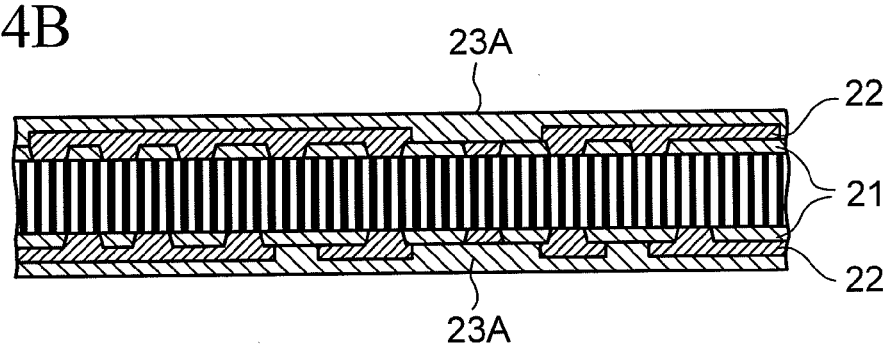
Figure 4C:
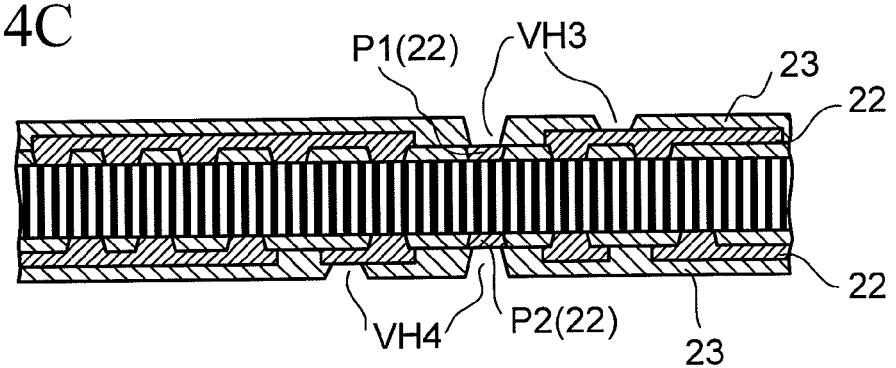
Figure 5A:
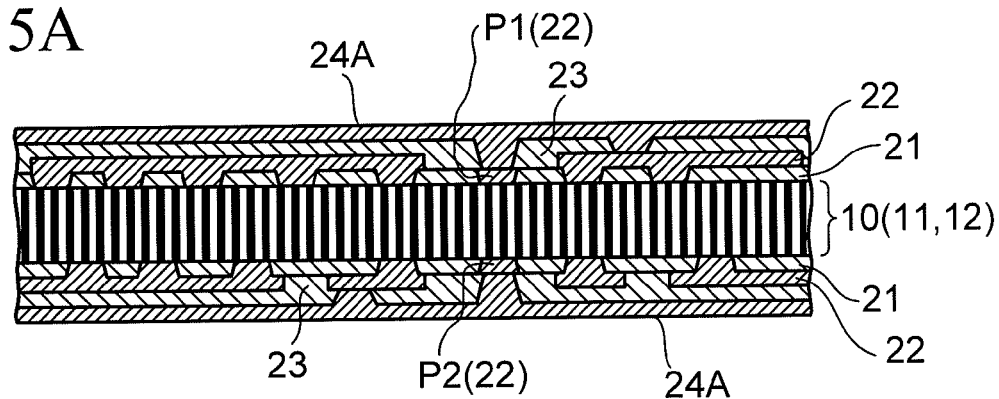
FIGS. 5A to 5C are sectional views showing steps following the manufacturing steps shown in FIGS. 4A to 4C.
Figure 5B:
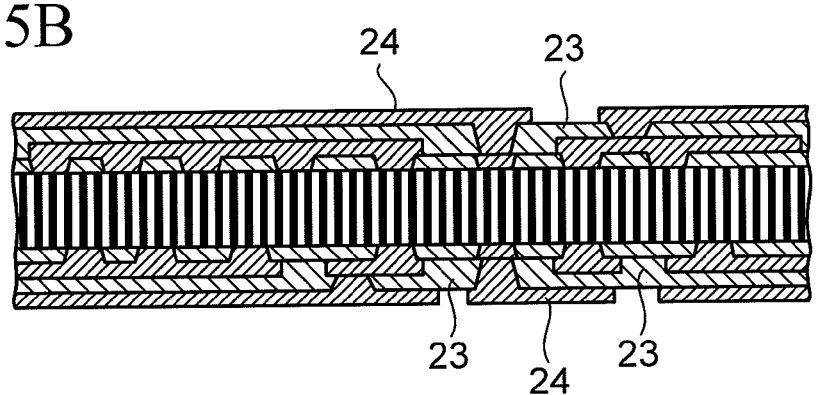
Figure 5C:
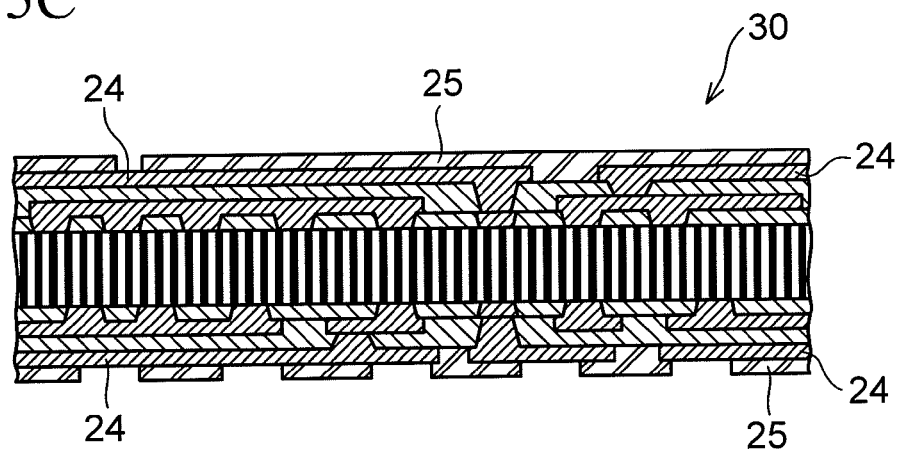

In the next step (see FIG. 5B), in the same manner performed in the step of FIG. 4A, the second wiring layers 24 of desired shapes are formed by patterning the conductor layers 24A on the respective sides of the core substrate 10.

In the final step (see FIG. 5C), solder resist layers 25 are formed on the wiring layers 24 and the exposed insulating layers 23 on the respective sides of the core substrate 10 in such a manner that the solder resist layers 25 cover the surfaces of the resultant core substrate 10 but expose pad portions defined at desired positions of the respective wiring layers 24. For example, the surfaces are coated with a photosensitive epoxy resin (solder resist), and the resin layers thus coated are patterned into desired shapes (shapes from which the pad portions are exposed) to thereby form the solder resist layers 25.

Each pad (portion of the wiring layers 24) exposed from the opening of each of the solder resist layers 25 is bonded to an electrode terminal of a chip mounted on this package 30 or an external connection terminal (a solder ball, a metal pin, or the like) used when this package 30 is mounted on a motherboard or the like. For this reason, it is desirable to perform Ni plating and Au plating in this order on the pad (Cu). Here, the Ni layer is provided to enhance the adhesion between the Cu layer and the Au layer, and to prevent Cu from diffusing into the Au layer. The outermost Au layer is provided to improve the contact bonding properties when the electrode terminal of the chip or the like is eventually bonded thereto.

Thus, the wiring board (package) 30 of this embodiment is manufactured as illustrated. The wiring board (package) 30 is intended as described above for use while being mounted on a mounting board such as a motherboard through the external connection terminals provided on one surface of the wiring board 30 with a semiconductor element mounted on the other surface of the wiring board 30.

Figure 6:
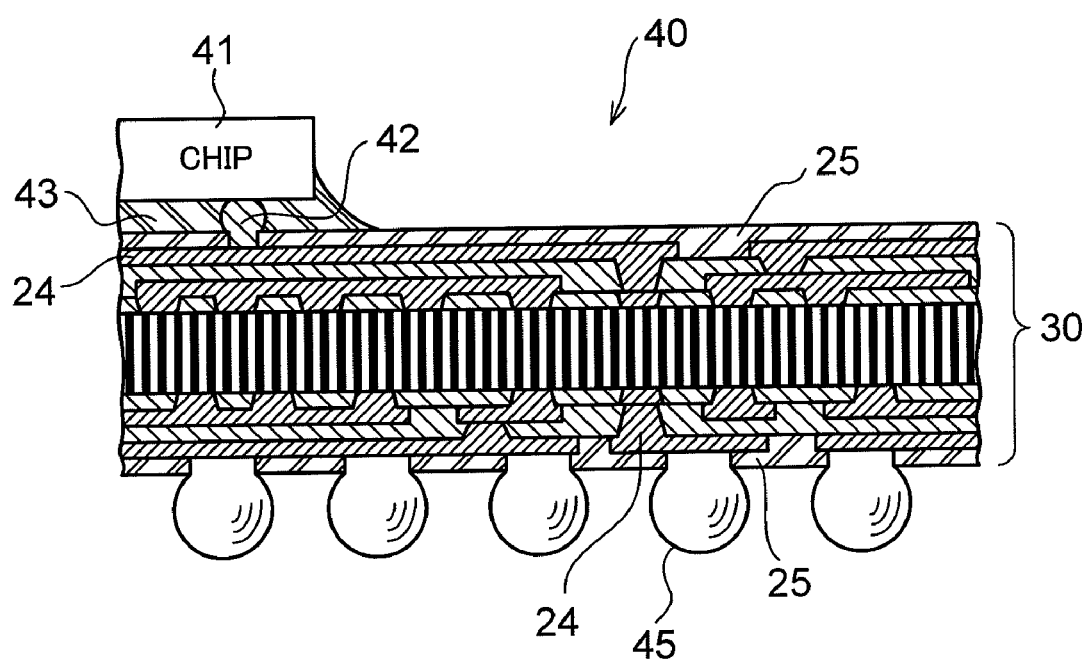
FIG. 6 is a sectional view showing the state (semiconductor device) in which a semiconductor element (chip) is mounted on the wiring board in FIG. 1.

FIG. 6 shows an example of the mounting state (semiconductor device 40) where a semiconductor element (silicon chip 41) is mounted on the wiring board (package) 30. In the semiconductor device 40, an electrode terminal 42 of the chip 41 is electrically connected to the pad of the corresponding wiring layer 24 on the wiring board 30 through a conductive material such as a solder bump (flip chip mounting). Further, an underfill resin 43 such as a thermosetting epoxy resin is filled in a gap between the chip 41 thus mounted and the wiring board 30, and is thermally cured to ensure the mechanical bonding between the chip 41 and the wiring board 30.

Meanwhile, solder balls 45 used as the external connection terminals are bonded to the pads of the wiring layer 24, exposed from the solder resist layer 25, on a side opposite to the chip mounting surface side. The wiring board 30 is mounted on a motherboard or the like through solder balls 45.

As has been described, according to the configuration of the wiring board (package) 30 of this embodiment, the filamentous conductors 12 each having a small diameter are densely provided in the insulating base material 11 of the core substrate 10 and pierce the insulating base material 11 in the thickness direction. Two types of pads (see FIGS. 2A and 2B) constituted of the portions of the wiring layers 22 are formed at desired positions on the surfaces of the core substrate 10. Specifically, the two types of pads are: the pads P1 and P2 oppositely connected to (disposed on) the respective ends of groups each formed of a plurality of filamentous conductors 12 in such a manner that the pads P1 and P2 share the filamentous conductors 12; and the pads P3 and P4 respectively connected only to corresponding one end sides of different groups each formed of a plurality of filamentous conductors 12.

Thereby, the wiring layer 22 (and the wiring layer 24 continuous therewith) formed on one surface side of the core substrate 10 and the wiring layer (and the wiring layer 24 continuous therewith) formed on the other surface side thereof are electrically connected to each other through the pair of pads P1 and P2 oppositely disposed on the respective sides of the core substrate 10 and the plurality of filamentous conductors 12 continuing to the pads. Namely, it is no longer necessary to prepare a specific core substrate in accordance with the type of a package, the function of a chip component to be mounted, and so forth, as in a conventional technique. Only by altering the sizes and positions of the pads P1 and P2 disposed on the respective surfaces of the core substrate 10 as appropriate, such a connection between the surfaces of the core substrate 10 is easily made through the filamentous conductors 12 each of which has a small diameter and which is formed in core substrate 10.

According to this embodiment as described above, the core substrate 10 is shared, and hence the manufacturing cost is reduced. Moreover, the diameter of a connecting pad does not need to be increased in accordance with the alignment accuracy of through-holes in the core substrate, and so forth, as performed in the prior art. Thus, the freedom in wiring design is enhanced, and the wiring density of the entire wiring board is improved.

Furthermore, the pads P3 and P4 are disposed on the respective surfaces of the core substrate 10 in a particular arrangement as exemplified in FIG. 2B. Accordingly, when these pads P3 and P4 are utilized as capacitor electrodes and the insulating base material 11 in the core substrate 10 is utilized as a dielectric, portions of the core substrate 10 (regions where the pads P3 and P4 are formed) can function as a capacitor. Namely, a capacitor function is easily built in the package 30.

Along with the recent development of thinner and smaller electronic devices such as mobile devices and portable devices, a technique to build a capacitor function in a board (package) has been put into practice. However, there is a problem pointed out to any conventional methods which have been implemented (typically, a method in which a board including a film-form capacitor buried therein is connected to a wiring layer, a method in which a ferroelectric layer is formed on an electrode layer (conductor layer) in a board, and the like) that it is difficult to obtain a sufficiently large capacitance, due to restriction on design, for a desired decoupling effect. Particularly, in order to increase the area between opposed electrodes (a portion of a conductor layer) sandwiching a dielectric as means for obtaining a large capacitance, a large area of the conductor layer has to be allocated only for the electrodes. Consequently, the freedom in designing other wiring patterns is impaired.

In contrast, according to the configuration of the package 30 of this embodiment, when design is made such that the sizes and relative positions of capacitor electrodes (pads P3 and P4) disposed on the respective surfaces of the core substrate 10 are altered as appropriate, the capacitance of the capacitor is easily changed, meeting a larger capacitance requirement. Additionally, since such a capacitor is built in a portion of the core substrate 10, the freedom in designing a wiring pattern for the build-up layers 20 is not affected.

For example, suppose that such a capacitor structure (a portion of the core substrate 10) is provided between a pad connected to a wiring layer continuing to a power supply terminal of the chip 41 (FIG. 6) mounted on this package 30 and a pad connected to a wiring layer continuing to a ground terminal of the chip 41. In this case, the inductance of the wiring connecting the capacitor to the chip 41 can be equivalently reduced. This enables effective decoupling of the power supply line and the like. Particularly, when the chip 41 to be mounted is a device requiring a high-speed switching operation such as a MPU, such "decoupling" is useful.

Moreover, as the material for the core substrate 10 (the insulating base material 11, namely, the base material of this package 30), used is alumina having a coefficient of thermal expansion (CTE: approximately 6 to 7 ppm/° C.) made closest possible to the CTE (approximately 3 ppm/° C.) of the silicon chip 41 (FIG. 6) to be mounted. Accordingly, even when a stress (thermal stress) attributable to the difference in CTE between the chip 41 and the package 30 is generated therebetween at the time of mounting and subsequent use of the chip (at the time of conducting a current), the core substrate 10 effectively absorbs (relaxes) the generated thermal stress (which may warp the package). This contributes to an improvement in the reliability of connection between the package 30 and the chip 41 to be mounted.

Moreover, suppose that the pads P1 and P2 oppositely disposed (connected) opposite to each other are utilized as signal terminals. In this case, filamentous conductors 12 connected to a pad continuing to a ground wiring are arranged around the plurality of filamentous conductors 12 connected to the pads P1 and P2, demonstrating a peculiar effect. Specifically, a shielding (blocking) effect is demonstrated because this configuration has a structure equivalent to that of a coaxial line. Furthermore, since ground layers are arranged to surround the pads P1 and P2, electrical coupling (capacitive coupling) between the signal terminals (the pads P1 and P2) and adjacent signal terminals (pads P1 and P2 similarly oppositely disposed opposite to each other) is reduced. Thus, the configuration prevents the signal terminals themselves from acting as a noise source.

In the above-described embodiment, the description has been given by taking the example where an inorganic dielectric such as alumina is used as the material for the insulating base material 11 of the core substrate 10. However, it is needless to say that the material for the substrate is not limited thereto. Specifically, as apparent from the gist of the present invention (sharing of the core substrate, improvement in wiring density, and enhancement of the freedom in wiring design), when the core substrate does not need to function as a capacitor, an inorganic dielectric does not always have to be used as the material of the substrate. For example, an organic resin represented by an epoxy resin, a polyimide resin, or the like, can be used.

When an organic resin is used as the material of the insulating base material 11, it is desirable that an inorganic filler such as silica be densely mixed with the organic resin to be used. Since the coefficient of thermal expansion (CTE) of silica is as low as 0.5 ppm/° C., the inorganic filler contributes to lowering of the CTE of the core substrate 10 as a whole. Namely, by lowering the CTE of the core substrate 10 (the base material of the package 30), the CTE of the package 30 as a whole is made closer to the CTE of a semiconductor chip to be mounted. Thereby, when the chip is mounted on the package 30 and a stress (thermal stress) attributable to the difference in CTE is generated therebetween, the core substrate 10 effectively relaxes the stress (thermal stress) similarly to the case where the inorganic dielectric such as alumina is used. Incidentally, alumina, silicon nitride, aluminum nitride, or the like can be used, instead of silica, as the inorganic filler added to the resin.

Meanwhile, when an organic resin is used as the insulating base material 11, in the step of FIG. 3A, the through-holes TH to be provided in the insulating base material 11 are formed by a perforating process using a carbon dioxide laser, excimer laser, or the like. Then, in the step of FIG. 3B, the metal material can be filled in the through-holes TH by a plating method. As the metal material, Cu, Ni, or the like is preferably used from the viewpoint of availability, processability, and so forth. For example, when Cu is used as the metal material, a seed layer is formed on the surface of the insulating base material 11 (inclusive of the inner wall surfaces of the through-holes TH) by Cu electroless plating. By electro copper (Cu) plating using the seed layer as a power supply layer, the conductor (Cu) is filled in the through-holes TH. Instead, merely the use of Cu electroless plating method may be adopted to fill the through-holes TH.

What is claimed is:
1. A wiring board comprising:
    a core substrate having a structure including an insulating base material made of an inorganic dielectric and a plurality of filamentous conductors provided in the insulating base material and piercing the insulating base material in a thickness direction thereof;
    a pair of connected pads made of portions of wiring layers oppositely disposed on one surface and the other surface of the core substrate, and electrically connected to opposite ends of a plurality of first selected filamentous conductors of the plurality of filamentous conductors in such a manner that the pair of the connected pads share the first selected filamentous conductors;
    first capacitively coupled pads made of portions of the wiring layers disposed on the one surface of the core substrate, and electrically connected only to one ends of a plurality of second selected filamentous conductors which are not selected for the connected pads among the plurality of filamentous conductors; and
    second capacitively coupled pads made of portions of the wiring layers, disposed on the other surface of the core substrate, and electrically connected only to one ends of a plurality of third selected filamentous conductors which are not selected for the connected pads and the first capacitively coupled pads among the plurality of filamentous conductors, wherein a wiring connection between one surface side and the other surface side of the core substrate is made through the pair of the connected pads, and a capacitor is formed of the second selected filamentous conductors, the third selected filamentous conductors and the insulating base material existing therebetween.

2. The wiring board according to claim 1, wherein the plurality of filamentous conductors in the insulating base material of the core substrate are arranged in such a manner that a distance between two adjacent filamentous conductors is smaller than a diameter of each of the filamentous conductors.

3. The wiring board according to claim 1, wherein insulating layers are formed on one surface and the other surface of the core substrate so as to cover regions between the pads, respectively, and the wiring layers are formed integrally with the pads, on the insulating layers, respectively.

4. The wiring board according to claim 3, wherein the plurality of filamentous conductors in the insulating base material of the core substrate include a filamentous conductor which is not connected to and thus isolated from any of the pads.

5. The wiring board according to claim 4, wherein the plurality of filamentous conductors in the insulating base material of the core substrate include filamentous conductors which are positioned around a plurality of filamentous conductors connected to a pad continuing to a signal wiring, and which are connected to a pad continuing to a ground wiring.

6. The wiring board according to claim 2, wherein each of the plurality of filamentous conductors is formed to have a diameter in a range of 30 nm or more to 2 μm or less.

* * * * *